United States Patent [19]

Ohba et al.

[11] Patent Number: 5,034,957
[45] Date of Patent: Jul. 23, 1991

[54] SEMICONDUCTOR LASER DEVICE

[75] Inventors: Yasuo Ohba, Yokohama; Yukie Nishikawa, Narashino; Hajime Okuda, Yokohama; Masayuki Ishikawa; Hideto Sugawara, both of Tokyo; Hideo Shiozawa; Yoshihiro Kokubun, both of Yokohama, all of Japan

[73] Assignee: Kabushiki Kaisha Toshiba, Kawasaki, Japan

[21] Appl. No.: 307,278

[22] Filed: Feb. 7, 1989

[30] Foreign Application Priority Data

Feb. 10, 1988 [JP] Japan ............................. 63-027668
Feb. 22, 1988 [JP] Japan ............................. 63-037543
Mar. 25, 1988 [JP] Japan ............................. 63-069641

[51] Int. Cl.$^5$ .............................................. H01S 3/19
[52] U.S. Cl. ........................................ 372/45; 372/46
[58] Field of Search ............................ 372/45, 44, 46

[56] References Cited

U.S. PATENT DOCUMENTS 4,792,958 12/1988 Ohba ..................................... 372/45

FOREIGN PATENT DOCUMENTS 234955 9/1987 European Pat. Off. .
62-176183 8/1987 Japan .

OTHER PUBLICATIONS

Y. Kawamura et al., "0.66 mum Room-Temperature Operation of InGaAip DH Laser Diodes Grown by MBE", Electronics Letters, vol. 19, No. 5, Mar. 1983, pp. 163-165.

M. Ishikawa et al., "Room-Temperature cw Operation of InGaP/InGaAiP Visible Light Laser Diodes on GaA Substrates Grown by Metalorganic Chemical Vapor Deposition", Applied Physics Letters, vol. 48, No. 3, 1-86, pp. 207-208.

Hino et al., "Continuous Wave Operation (77K), of Yellow (583.6 nm) Emitting AlGaInP Double Heterostructure Laser Diodes", Applied Physics Letters, vol. 48, No. 9, Mar. 3, 1986, pp. 557-558.

Tanaka et al., "InGaP/InGaAlP Double-Heterostructure and Multiquantum-Well Laser Diodes Grown by Molecular-Beam Epitaxy", J. Appl. Phys., vol. 61, No. 5, 3/1/87, pp. 1713-1719.

Ikeda et al., "Yellow-Emitting AlGaInP Double Heterostructure Laser Diode at 77K Grown by Atmospheric Metalorganic Chemical Vapor Deposition", Appl. Phys. Lett., vol. 45, No. 9, 11/1/84, pp. 964-966.

Primary Examiner—James W. Davie
Attorney, Agent, or Firm—Foley & Lardner

[57] ABSTRACT

A semiconductor laser device using double heterostructure comprised of $In_xGa_yAl_{1-x-y}P$ ($0 \leq x \leq 1, 0 \leq y \leq 1$), capable of preventing the leakage of the carriers and thereby reducing the threshold current, being operative with small threshold current density and at high temperature, and having a long lifetime. The device may include a double heterostructure formed on the GaAs substrate, comprised of $In_xGa_yAl_{1-x-y}P$ ($0 \leq x \leq 1, 0 \leq y \leq 1$) including an active layer, the active layer having an impurity concentration not greater than $5 \times 10^{16}$ cm$^{-3}$. The device may include a double heterostructure formed on the GaAs substrate, comprised of InGaP active layer and p-type $In_q(Ga_{1-z}Al_z)_qP$ ($0 \leq q \leq 1, 0 \leq z \leq 1$) cladding layer with a value of z between 0.65 and 0.75. The device may include a double heterostructure formed on the GaAs substrate, comprised of $In_xGa_yAl_{1-x-y}P$ ($0 \leq x \leq 1, 0 \leq y \leq 1$) including an n-type cladding layer and an p-type cladding layer, one of the n-type cladding layer and the p-type cladding layer being Si-doped. A method of manufacturing the device is also disclosed.

22 Claims, 8 Drawing Sheets

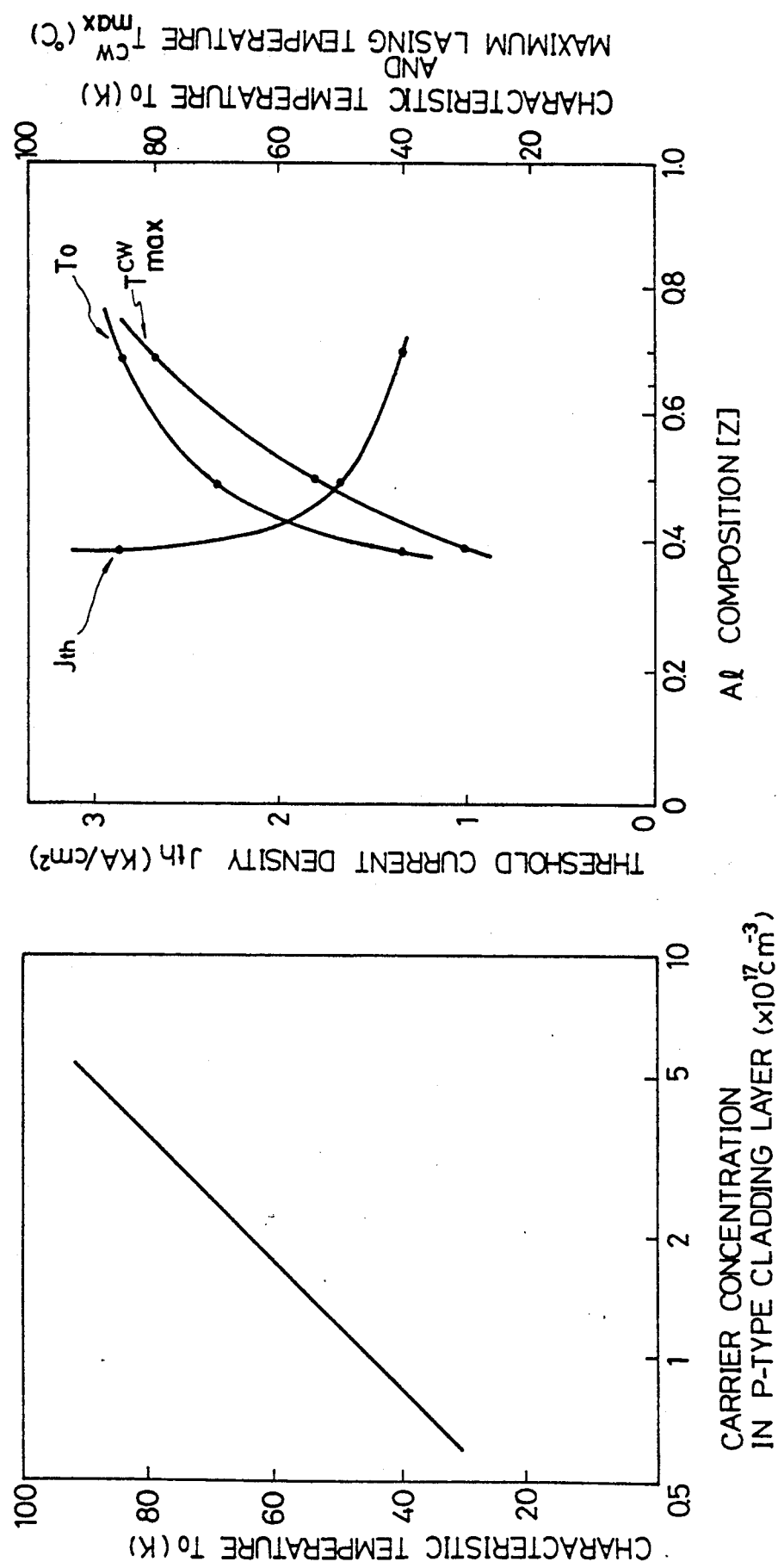

SEMICONDUCTOR LASER DEVICE

BACKGROUND OF THE INVENTION

1. Field of the Invention

The present invention relates to a semiconductor laser device using double heterostructure comprised of semiconductive material of composition $In_xGa_yAl_{1-x-y}P$ ($0 \leq x \leq 1$, $0 \leq y \leq 1$).

2. Description of the Background Art

Lately, much attention has been paid for a visible light semiconductor laser device using double heterostructure comprised of semiconductive material of composition $In_xGa_yAl_{1-x-y}P$ ($0 \leq x \leq 1$, $0 \leq y \leq 1$) manufactured as metalorganic materials grown on GaAs substrate by metalorganic chemical vapor deposition (referred hereafter as MOCVD) or by molecular beam epitaxy (referred hereafter as MBE). In particular, crystalline InGaAlP among the group III-V composite semiconductive materials is considered to be important in constructing a short wavelength semiconductor laser device. There has been reports of such devices with over 1,000 hours lifetime.

Now, a threshold current for lasing of a semiconductor laser device should preferably be low, so as to reduce amounts of current in operational state as well as to improve lifetime characteristics of the device. This threshold current is determined by an amount of carriers leaking through an active layer and, in particular, it is considered that preventing the leakage of electrons of small effective mass into a p-type cladding layer has significant effect.

In this regard, a conventional laser device using $Ga_{1-r}Al_rAs$ ($0 \leq r \leq 1$) has little problem in reducing the threshold current, since in such a conventional laser device it is possible to make a conduction band discontinuity between an active layer and a p-type cladding layer sufficiently large which can contribute to the prevention of the leakage of electrons from the active layer into the p-type cladding layer.

However, since $In_xGa_yAl_{1-x-y}P$ ($0 \leq x \leq 1$, $0 \leq y \leq 1$) has a smaller conduction band discontinuity than $Ga_{1-r}Al_rAs$ ($0 \leq r \leq 1$), it has been difficult for a semiconductor laser device using $In_xGa_yAl_{1-x-y}P$ ($0 \leq x \leq 1$, $0 \leq y \leq 1$) to achieve a sufficient prevention of the leakage of electrons from the active layer into the p-type cladding layer, or in other words, an effective confinement of carriers.

Thus, conventionally a semiconductor laser device using $In_xGa_yAl_{1-x-y}P$ ($0 \leq x \leq 1$, $0 \leq y \leq 1$) has been associated with a relatively high threshold current and various disadvantages arising from this such as those mentioned above.

In addition, a semiconductor laser device using $In_xGa_yAl_{1-x-y}P$ ($0 \leq x \leq 1$, $0 \leq y \leq 1$) has other difficulties concerning a threshold current density and a characteristic temperature.

Namely, the band gap energy of a semiconductor laser device using $In_xGa_yAl_{1-x-y}P$ ($0 \leq x \leq 1$, $0 \leq y \leq 1$) grown on GaAs substrate can be varied between approximately 1.8 eV and 2.35 eV by changing the amount of Ga and Al, i.e., x and y in the expression. This range of the band gap energy corresponds to the lasing wavelength of approximately 0.68 μm to 0.56 μm. Actual compositions most commonly employed for such a semiconductor laser device are the active layer of $Ga_{0.5}In_{0.5}P$ and the p-type cladding layer of $(Al_zGa_{1-z})_{0.5}In_{0.5}P$ ($0 \leq z \leq 1$). The value of z is typically chosen to be between 0.4 and 0.5.

However, photoluminescence (PL) peak wavelengths at room temperature (25° C.) of such a semiconductor laser device measured as a function of z, which are shown in FIG. 1 where the vertical axis is wavelength γ and horizontal axis is z, shows that the expression:

$$\lambda = -172z + 662 \text{ (nm)}$$

holds for $z < 0.7$. From this information, the band gap ΔEg between the active layer and the p-type cladding layer can be derived to be ΔEg=0.215 eV for z=0.4, and ΔEg=0.28 eV for z=0.5, both of which failing to satisfy ΔEg≧0.3 eV which is considered to be a necessary condition for a semiconductor device to be operative with low threshold current, at a high temperature. In fact, a sample semiconductor laser device of whole electrode type possessed very large threshold current density of 3 kA/cm² for z=0.4, and relatively large threshold current density of 1.6-2 kA/cm² for z=0.5. Moreover, the characteristic temperature was small for this sample semiconductor laser device so that emission at high temperature was not obtainable.

Thus, conventionally it has been very difficult, if not impossible, to make a semiconductor laser device using $In_xGa_yAl_{1-x-y}P$ ($0 \leq x \leq 1$, $0 \leq y \leq 1$) having the band gap ΔEg≧0.3 eV, so that the threshold current density has been large and the characteristic temperature has been small.

Furthermore, use of MOCVD for growing $In_xGa_yAl_{1-x-y}P$ ($0 \leq x \leq 1$, $0 \leq y \leq 1$) give rises to further problems related to doping.

Namely, MOCVD has conventionally been carried out with selenium (Se) obtained from hydrogen selenide ($H_2Se$) as n-type dopant. Yet, there has been scarcely any study on controllability of Se-doping applied to $In_xGa_yAl_{1-x-y}P$ ($0 \leq x \leq 1$, $0 \leq y \leq 1$). With this respect, the doping efficiencies of Se-doping from $H_2Se$ in MOCVD for growing on GaAs substrate, $In_xGa_yAl_{1-x-y}P$ ($0 \leq x \leq 1$, $0 \leq y \leq 1$), and GaAs are shown in FIG. 2. In addition, substrate temperature dependences of the doping efficiencies for InGaP and InAlP are shown in FIGS. 3 and 4, respectively.

From FIGS. 2, 3, and 4, the following problems of growing of Se-doped InGaAlP by MOCVD can be deduced:

(i) The doping efficiencies depend heavily on composition, which makes uniform doping difficult, especially at boundaries of different compositions.

(ii) When InGaAlP is grown on GaAs substrate such that the density of Se in GaAs becomes about $1 \times 10^{18}$ cm$^{-3}$, due to diffusions and other effects the density of Se in InGaAlP nearby GaAs substrate becomes almost $1 \times 10^{19}$ cm$^{-3}$ as a doping efficiency of InGaAlP is greater than that of GaAs by order of one, which greatly lessens the lifetime of the device.

(iii) The doping efficiencies also depends heavily on the substrate temperature and, in particular, considerable variation in the carrier density in InAlP is caused by a slight variation in the substrate temperature, which makes stable doping difficult.

SUMMARY OF THE INVENTION

It is therefore an object of the present invention to provide a semiconductor laser device using double heterostructure comprised of semiconductive material of composition $In_xGa_yAl_{1-x-y}P$ ($0 \leq x \leq 1$, $0 \leq y \leq 1$), capable of preventing the leakage of the carriers and thereby reducing the threshold current.

Another object of the present invention is to provide a semiconductor laser device using double heterostructure comprised of semiconductive material of composition $In_xGa_yAl_{1-x-y}P$ ($0 \leq x \leq 1$, $0 \leq y \leq 1$), capable of being operative with small threshold current density and at high temperature.

Another object of the present invention is to provide a semiconductor laser device using double heterostructure comprised of semiconductive material of composition $In_xGa_yAl_{1-x-y}P$ ($0 \leq x \leq 1$, $0 \leq y \leq 1$), having a long lifetime, and a method of manufacturing such a semiconductor laser device.

According to one aspect of the present invention there is provided a semiconductor laser device, comprising: a GaAs substrate; and a double heterostructure formed on the GaAs substrate, comprised of $In_xGa_yAl_{1-x-y}P$ ($0 \leq x \leq 1$, $0 \leq y \leq 1$) including an active layer, the active layer having a carrier concentration not greater than $5 \times 10^{16}$ cm$^{-3}$.

According to another aspect of the present invention there is provided a semiconductor laser device, comprising: a GaAs substrate; and a double heterostructure formed on the GaAs substrate, comprised of InGaP active layer and p-type $In_{1-q}(Ga_{1-z}Al_z)_qP$ wherein z is between 0.65 and 0.75 and q is less than 1.

According to another aspect of the present invention there is provided a semiconductor laser device, comprising: a GaAs substrate; and a double heterostructure formed on the GaAs substrate, comprised of $In_xGa_yAl_{1-x-y}P$ ($0 \leq x \leq 1$, $0 \leq y \leq 1$) including an n-type cladding layer and an p-type cladding layer, the n-type cladding layer being Si-doped.

According to another aspect of the present invention there is provided a method of manufacturing semiconductor laser device comprising the steps of: placing GaAs substrate in a reaction chamber; heating up the GaAs substrate with raw material gases belonging to the group III and the group V; and forming on the GaAs substrate an n-type cladding layer, an active layer and a p-type cladding layer by MOCVD, the n-type cladding layer being formed with silane gas as a raw material for dopant.

Other features and advantages of the present invention will become apparent from the following description taken in conjunction with the accompanying drawings.

BRIEF DESCRIPTION OF THE DRAWINGS

FIG. 11 is a graph of the characteristic temperature versus the carrier concentration in the p-type cladding layer for the semiconductor laser device shown in FIG. 5.

FIG. 12 is a graph of the threshold current density versus amount of Al in the p-type cladding layer for the semiconductor laser device shown in FIG. 5, showing in addition the characteristic temperature and the maximum lasing temperature as a functions of amount of Al in the p-type cladding layer.

DETAILED DESCRIPTION OF THE PREFERRED EMBODIMENTS

Figure 1:
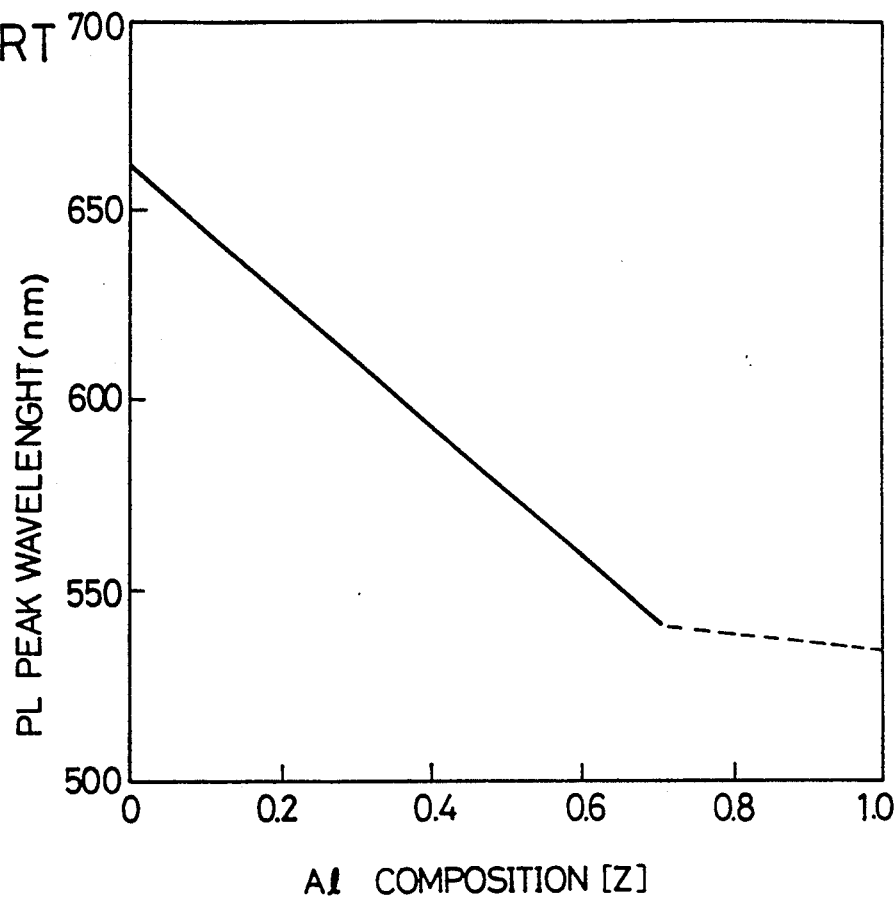
FIG. 1 is a graph of photoluminescence (PL) peak wavelength at room temperature (25° C.) versus amount of Al in the p-type cladding layer for a conventional semiconductor laser device.
Figure 2:
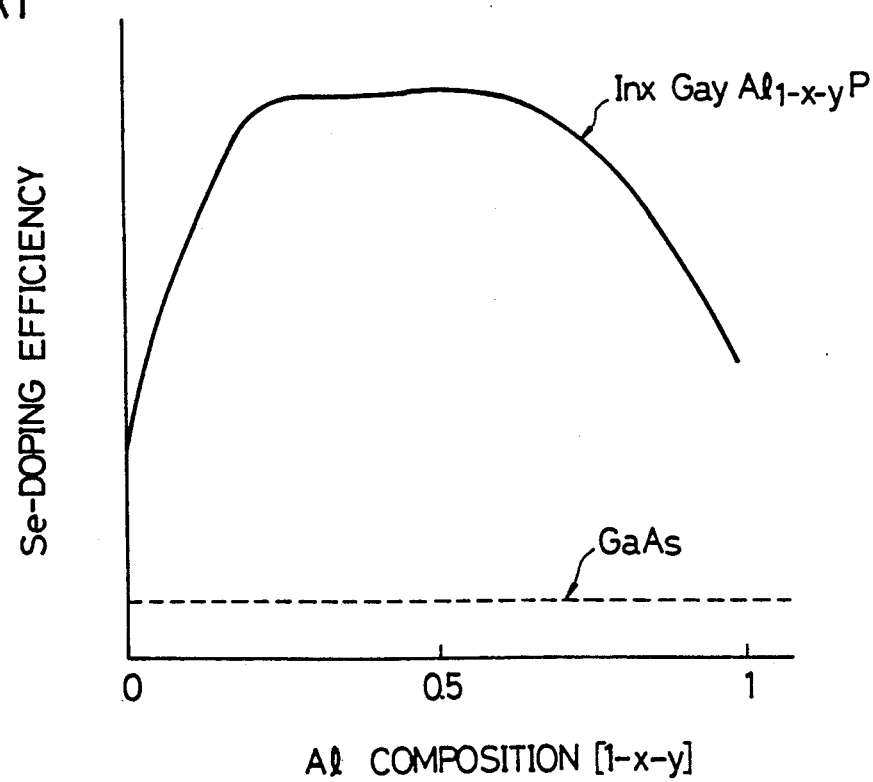
FIG. 2 is a graph of doping efficiencies of Se-doping from H$_2$Se in MOCVD for growing on GaAs substrate, $In_xGa_yAl_{1-x-y}P$ ($0 \leq x \leq 1$, $0 \leq y \leq 1$), and GaAs, versus amount of Al in the p-type cladding layer for a conventional semiconductor laser device.
Figure 3:
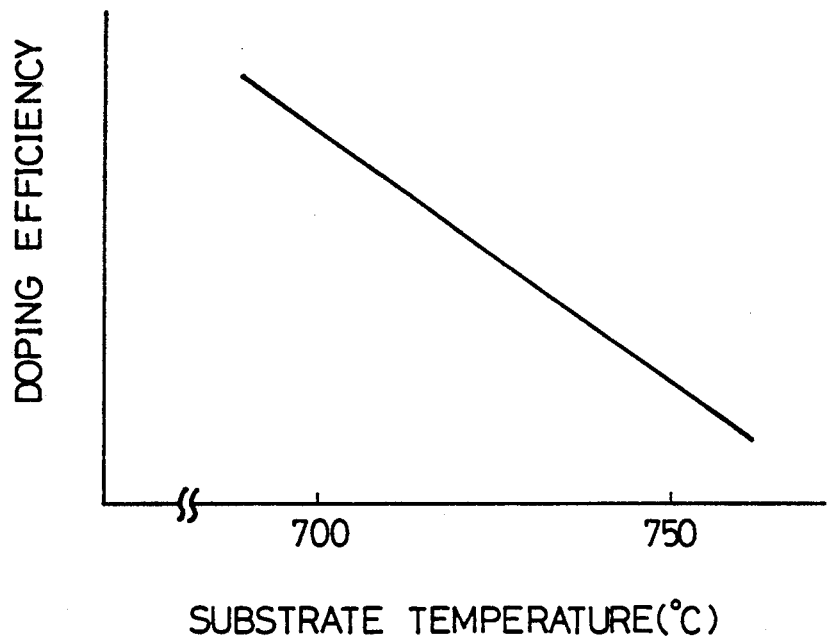
FIG. 3 is a graph showing substrate temperature dependences of the doping efficiencies for InGaP for a conventional semiconductor laser device.
Figure 4:
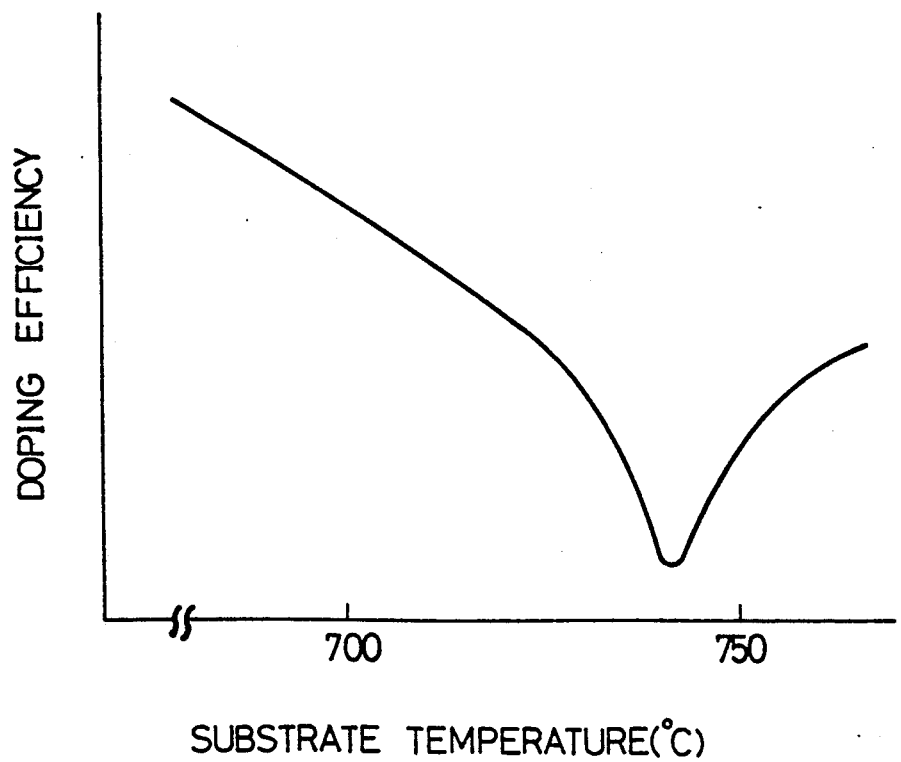
FIG. 4 is a graph showing substrate temperature dependences of the doping efficiencies for InAlP for a conventional semiconductor laser device.
Figure 5:
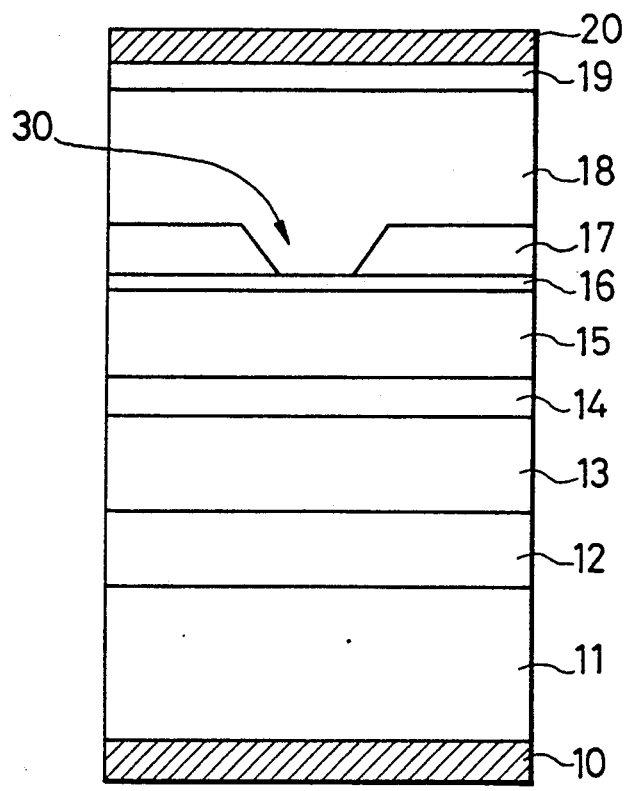
FIG. 5 is a schematic cross sectional view of a semiconductor laser device according to one embodiment of the present invention.

Referring now to FIG. 5, there is shown one embodiment of a semiconductor laser device according to the present invention.

This semiconductor laser device comprises multilayer structure of, from bottom to top, an AuGe electrode 10, an n-type GaAs substrate 11, an n-type GaAs buffer layer 12 of 0.5 μm thickness, an n-type $In_{0.5}Ga_{0.15}Al_{0.35}P$ cladding layer 13 of 0.6 μm thickness, an $In_{0.5}Ga_{0.5}P$ active layer 14 of 0.1 μm thickness, a p-type $In_{0.5}Ga_{0.15}Al_{0.35}P$ cladding layer 15 of 0.6 μm thickness, a p-type $In_{0.5}Ga_{0.5}P$ capping layer 16 of 0.05 μm thickness, an n-type GaAs block layer 17 of 0.6 μm thickness, a p-type GaAs contact layer 18 of 1.2 μm thickness, a p+-GaAs contact layer 19 of 0.3 μm thickness, and an AuZn electrode. There is a stripe-shaped current pinching section 30 at boundary between the n-type GaAs block layer 17 and the p-type GaAs contact layer 18, such that only the current pinching section 30 of the p-type GaAs contact layer 18 has a direct contact with the p-type $In_{0.5}Ga_{0.5}P$ capping layer 16. Because of this configuration, enterring currents will be confined in the current pinching section 30 as the current pinching section 30 acts as a pn inversion layer, and as a result, laser beam emission takes place in the $In_{0.5}Ga_{0.5}P$ active layer 14 along the current pinching section 30.

This multi-layer structure is grown by using reduced pressure MOCVD under the conditions of 730° C. substrate temperature, 25 Torr reaction chamber pressure, and 3 μm/h growing speed. The procedure of growing is as follows. First, layers from the n-type GaAs substrate 11 to the n-type GaAs block layer 17 are grown successively, and a stripe-shaped incision is made on the n-type GaAs block layer 17, then the p-type GaAs contact layer 18 and the $p^+$-GaAs contact layer 19 are grown.

Impurity in the p-type $In_{0.5}Ga_{0.15}Al_{0.35}P$ cladding layer 15 is zinc(Zn), and the carrier concentration in the $In_{0.5}Ga_{0.5}P$ active layer 14 is controlled by varying the carrier concentration in the p-type $In_{0.5}Ga_{0.15}Al_{0.35}P$ cladding layer 15 and thereby varying amount of diffusion of Zn into the $In_{0.5}Ga_{0.5}P$ active layer 14. Conventionally, magnesium(Mg) is also frequently used as impurity in the p-type cladding layer, but Mg is not desirable in this embodiment since it is difficult to control the formation of pn junction with this impurity.

Impurity in the n-type $In_{0.5}Ga_{0.15}Al_{0.35}P$ cladding layer 13 is Silicon(Si), unlike the conventional choice of Selenium(Se). This choice is significant because in the double heterostructure, the smallness of the carrier concentration difference between the active layer and the cladding layer necessitates a fine controlling of the carrier concentrations, and the use of Si as an n-type dopant improve the controllability of the carrier concentrations, such that the composition dependence of the doping efficiencies, particularly of the n-type GaAs buffer layer 12 and the n-type $In_{0.5}Ga_{0.15}Al_{0.35}P$ cladding cladding layer 13, can be lessened, the memory effect can be reduced, and the variation of the carrier concentration due to the change in the growth temperature can be reduced.

Since the diffusion of Si into the $In_{0.5}Ga_{0.5}P$ active layer 14 is negligible as Si is much less diffusive than Zn, the carrier concentration in the carrier concentration in the $In_{0.5}Ga_{0.5}P$ active layer 14 depends solely on the diffusion of Zn from the p-type $In_{0.5}Ga_{0.15}Al_{0.35}P$ cladding layer 15, and not on the carrier concentration in the n-type $In_{0.5}Ga_{0.15}Al_{0.35}P$ cladding layer 13 in this embodiment. In addition, this embodiment is characterized in that the carrier concentration in the $In_{0.5}Ga_{0.5}P$ active layer 14 is controlled to be less than or equal to $5 \times 10^{16}$ cm$^{-3}$. The significance of $5 \times 10^{16}$ cm$^{-3}$ will be explained in detail below.

The carrier concentrations in each layer of this embodiment are $5 \times 10^{17}$ cm$^{-3}$ for the n-type GaAs buffer layer 12, $1 \times 10^{17}$-$1 \times 10^{18}$ cm$^{-3}$ for the n-type $In_{0.5}Ga_{0.15}Al_{0.35}P$ cladding layer 13, $5 \times 10^{16}$-$5 \times 10^{17}$ cm$^{-3}$ for the p-type $In_{0.5}Ga_{0.15}Al_{0.35}P$ cladding layer 15, $7 \times 10^{17}$ cm$^{-3}$ for the p-type $In_{0.5}Ga_{0.5}P$ capping layer 16, $4 \times 10^{18}$ cm$^{-3}$ for the n-type GaAs block layer 17, $2 \times 10^{18}$ cm$^{-3}$ for the p-type GaAs contact layer 18, and $1 \times 10^{19}$ cm$^{-3}$ for the $p^+$-GaAs contact layer 19. These carrier concentrations are measured by the C-V method. In addition, this embodiment is characterized in that the carrier concentration in the $In_{0.5}Ga_{0.15}Al_{0.35}P$ cladding layer 15 is set to be less than or equal to one half of the maximum carrier concentration obtainable by Zn-doping. The significance of this last condition will also be explained in detail below.

Figure 6:
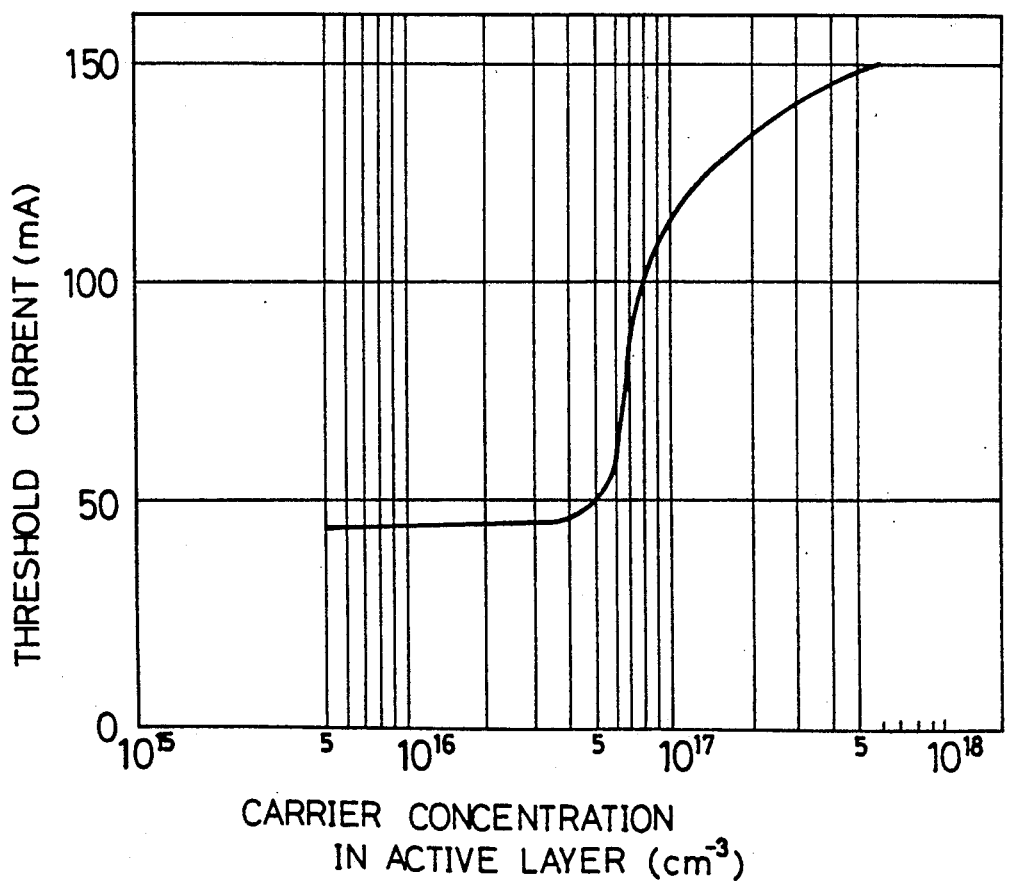
FIG. 6 is a graph of the threshold current versus carrier concentration in the active layer for the semiconductor laser device shown in FIG. 5.

The relationship between the carrier concentration in the $In_{0.5}Ga_{0.5}P$ active layer 14 and the threshold current for lasing in this embodiment is shown in FIG. 6. This graph was obtained by the semiconductor laser device according to the present invention as described above, with the carrier concentration in the n-type $In_{0.5}Ga_{0.15}Al_{0.35}P$ cladding layer 13 of $4 \times 10^{17}$ cm$^{-3}$, the stripe width of 7 μm, and the resonant cavity length of 300 μm. FIG. 6 shows that the threshold current becomes less than 50 mA when the carrier concentration in the $In_{0.5}Ga_{0.5}P$ active layer 14 is less than $5 \times 10^{16}$ cm$^{-3}$, but increases rapidly beyond 100 mA when the carrier concentration in the $In_{0.5}Ga_{0.5}P$ active layer 14 is greater than $5 \times 10^{16}$ cm$^{-3}$. Furthermore, the fact that the threshold current decreases until the carrier concentration in the $In_{0.5}Ga_{0.5}P$ active layer 14 becomes $5 \times 10^{15}$ cm$^{-3}$ had been established experimentally, and that the semiconductor laser device of this embodiment remains operative over 1000 hours at 40° C. temperature and 3 mW light output had been observed.

Thus, FIG. 6 clearly indicates that the confinement of the carriers and therefore the threshold current are greatly affected by the variation of the carrier concentration in the $In_{0.5}Ga_{0.5}P$ active layer 14. Consequently, it can be discerned that the carrier concentration in the $In_{0.5}Ga_{0.5}P$ active layer 14 plays a crucial role in constructing a semiconductor laser device using $In_xGa_yAl_{1-x-y}P$ ($0 \leq x \leq 1$, $0 \leq y \leq 1$) capable of preventing the leakage of the carriers and thereby reducing the threshold current.

This latter fact is due to the following reason. In a semiconductor laser device using $In_xGa_yAl_{1-x-y}P$ ($0 \leq x \leq 1$, $0 \leq y \leq 1$), in which the active layer is comprised of $In_{0.5}Ga_{0.5}P$, the energy gap between the active layer and the p-type cladding layer can be made sufficiently large by making the composition of Al, $1-x-y$, sufficiently large in the p-type cladding layer. This is because a built-in potential appears as a barrier for the carriers. The built-in potential is present in the depletion layer between the active layer and the p-type cladding layer, but the precise location of the depletion layer changes according to the carrier concentrations in the active layer and the p-type cladding layer. Namely, when the carrier concentration in the active layer is greater than that in the p-type cladding layer, most of the depletion layer is in the p-type cladding layer, in which case the built-in potential is ineffective in preventing the leakage of the electrons. On the other hand, when the carrier concentration in the active layer is sufficiently less than that in the p-type cladding layer, most of the depletion layer is in the active layer, in which case the electrons are bound by the built-in potential.

Now, the manner of controlling the carrier concentration in the $In_{0.5}Ga_{0.5}P$ active layer 14 will be explained.

Figure 7:
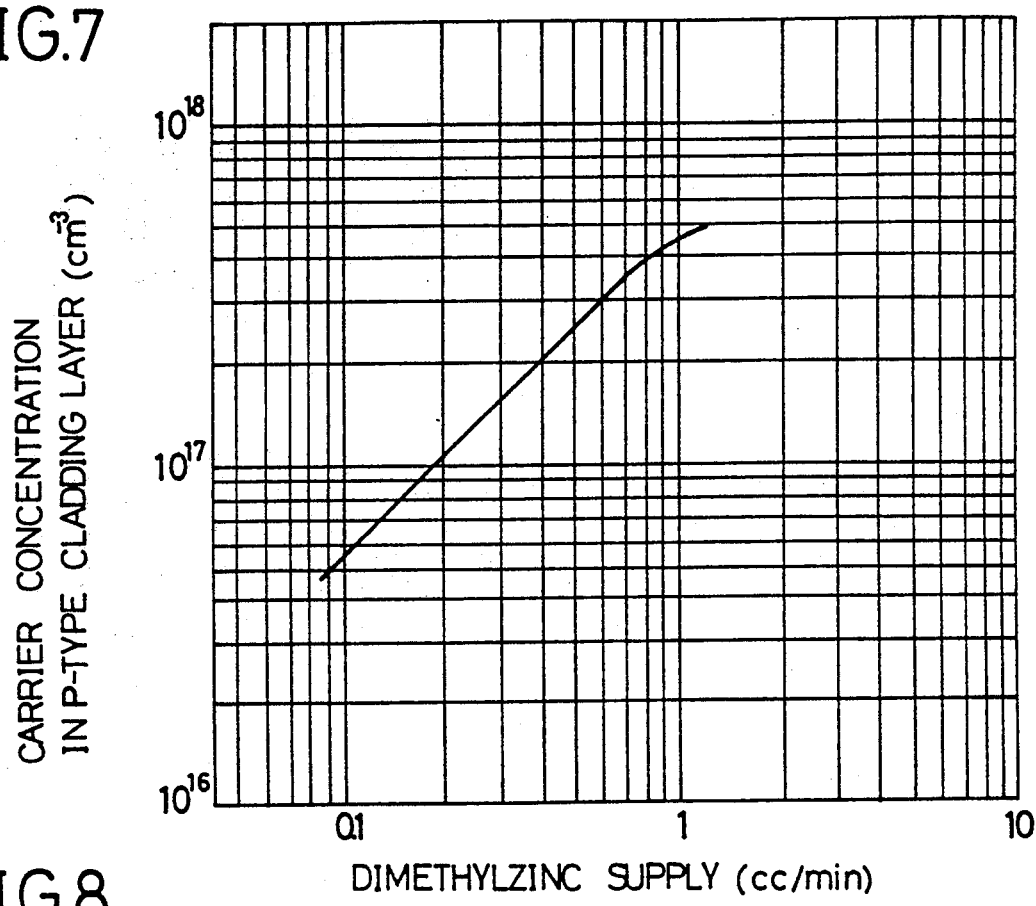
FIG. 7 is a graph of the carrier concentration in the p-type cladding layer versus amount of dimethylzinc supply for doping of the semiconductor laser device shown in FIG. 5.

Zn-doping characteristic of $In_{0.5}Ga_{0.15}Al_{0.35}P$ is shown in FIG. 7, in terms of the carrier concentration versus the amount of diluted dimethylzinc to be supplied from which the dopant Zn is obtained. FIG. 7 shows that when the amount of diluted dimethylzinc supply is less than 1 cc/min., the carrier concentration is proportional to the amount of dimethylzinc supply, but otherwise the carrier concentration gets saturated at $5 \times 10^{17}$ cm$^{-3}$.

Now, when the doping of the p-type cladding layer was carried out with such an amount of dimethylzinc supply for which the carrier concentration gets saturated, abrupt diffusion of Zn into the active layer occured and the carrier concentration in the active layer became over $1 \times 10^{17}$ cm$^{-3}$. On the other hand, when the doping of the p-type cladding layer was carried out with such an amount of dimethylzinc supply for which the Zn-doping characteristic has linear behavior, the diffusion of Zn was small, and moreover, when the carrier concentration in the p-type cladding layer was set to be less than a half of the maximum carrier concentration value obtainable, there was hardly any diffusion of Zn and the carrier concentration in the active layer became less than $1 \times 10^{16}$ cm$^{-3}$.

To be more specific, when the carrier concentrations in the n-type cladding layer and the p-type cladding layer were set to be $4 \times 10^{17}$ cm$^{-3}$ and $2 \times 10^{17}$ cm$^{-3}$, respectively, the carrier concentration in the active layer was less than $1 \times 10^{16}$ cm$^{-3}$ and the threshold current for lasing was 45 mA. This result was obtained with the stripe width of 7 μm and the resonant cavity length of 300 μm. The threshold current will be 50 mA for the carrier concentration in the active layer of less than $5 \times 10^{16}$ cm$^{-3}$, but the aforementioned result of the carrier concentration being less than $1 \times 10^{16}$ cm$^{-3}$ is more desirable.

Thus, in the Zn-doping of the p-type cladding layer, the diffusion of the Zn into the active layer, and thereby the threshold current, can be suppressed by setting the carrier concentration in the p-type cladding layer to be less than a half of the maximum value obtainable, which is $2.5 \times 10^{17}$ cm$^{-3}$.

Figure 8:
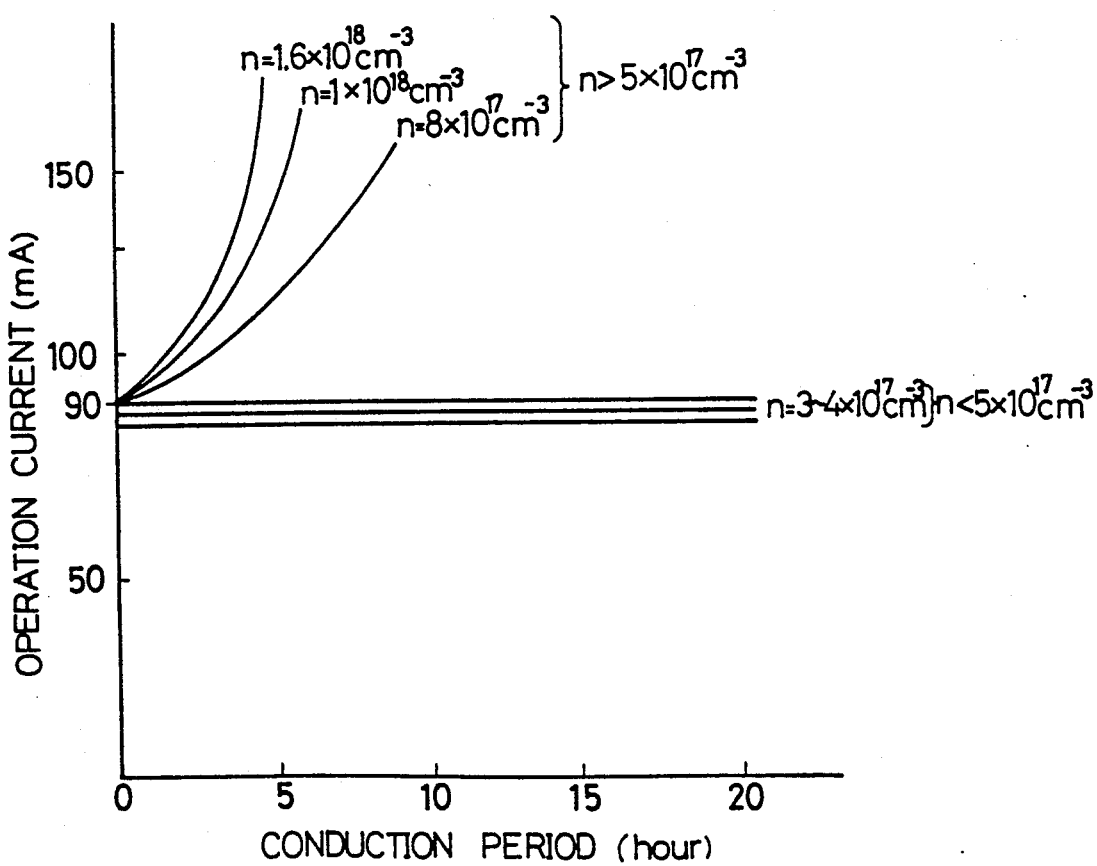
FIG. 8 is a graph of the operation current versus conduction period for the semiconductor laser device shown in FIG. 5.
Figure 9:
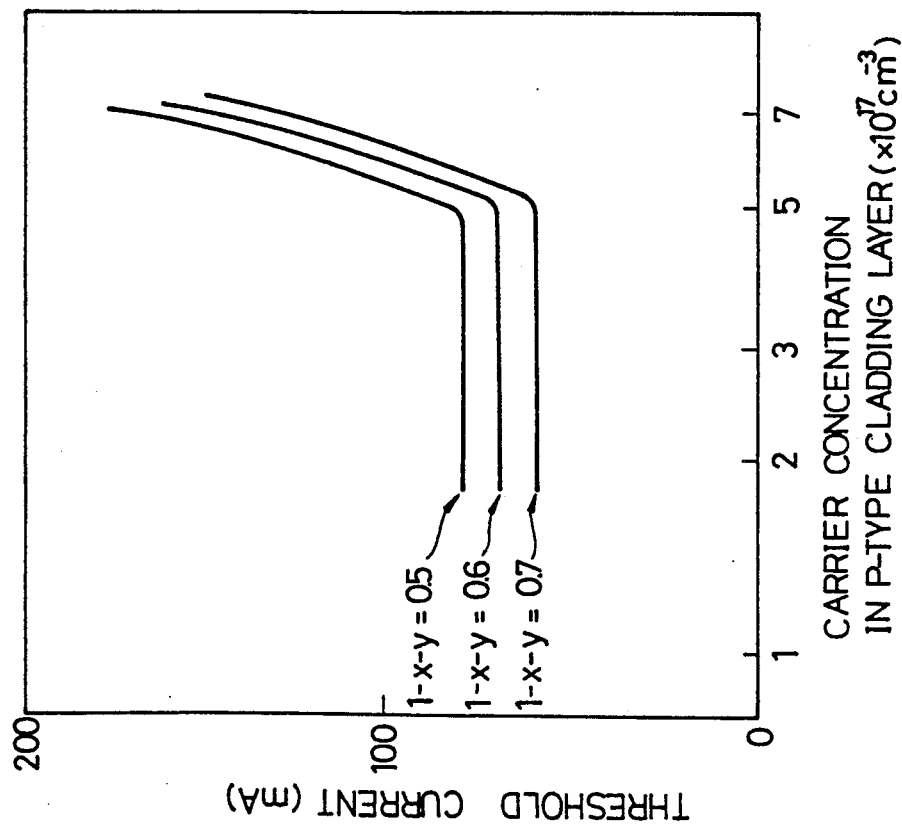
FIG. 9 is a graph of the threshold current versus the carrier concentration in the p-type cladding layer for the semiconductor laser device shown in FIG. 5.

The relationship between operation current and conduction period for this embodiment of semiconductor laser device is shown in FIG. 8. This graph was obtained with the carrier concentration in the p-type cladding layer of $2 \times 10^{17}$ cm$^{-3}$, the carrier concentration in the active layer of less than $1 \times 10^{16}$ cm$^{-3}$, the stripe width of 7 μm, and the resonant cavity length of 300 μm, at 40° C. temperature and 3 mW light output. FIG. 8 shows that when the carrier concentration in the n-type cladding layer became more than $5 \times 10^{17}$ cm$^{-3}$, the operation current increased sharply during the early conduction period and stable continuous wave operation was impossible. On the other hand, when the carrier concentration in the n-type cladding layer became less than $5 \times 10^{17}$ cm$^{-3}$, the operation current nearly constant at 90 mA and stable continuous wave operation was possible over 1000 hours. In addition, the relationship between the carrier concentration in the p-type cladding layer and the threshold current for lasing with the composition of Al in the p-type cladding layer as a variable shown in FIG. 9 indicates that when the carrier concentration in the p-type cladding layer is greater than $5 \times 10^{17}$ cm$^{-3}$ the threshold current abruptly increases due to the diffusion of Zn. On the other hand, when the carrier concentration in the p-type cladding layer is less than $2 \times 10^{17}$ cm$^{-3}$ the increase of the resistance causes heating up of the semiconductor laser device which in turn give rises to the increase of the threshold current from about 70 mA to about 80 mA and thereby lowers the characteristic temperature $T_0$. These arguments also indicate that the carrier concentration in the p-type cladding layer from $2 \times 10^{17}$ cm$^{-3}$ to $5 \times 10^{17}$ cm$^{-3}$ is desirable.

Next, the composition of Al in the p-type $In_{0.5}Ga_{0.15}Al_{0.35}P$ cladding layer 15, namely the specific value of 0.35, will be explained. For convenience, the p-type cladding layer will be expressed generically as $(Al_z Ga_{1-z})_q In_q P$ ($0 \leq z \leq 1$, $z = 1 - 2y$) in the following, so that for the p-type cladding layer 15, $z = 0.7$ and $q = 0.5$.

The value of q is required to be 0.5 so that lattice matching between GaAs substrate and $(Al_z Ga_{1-z})_q In_q P$ ($0 \leq z \leq 1$, $z = 1 - 2y$) can be made, but it is tolerable when the value is within the range of 0.45 and 0.55.

Figure 10:
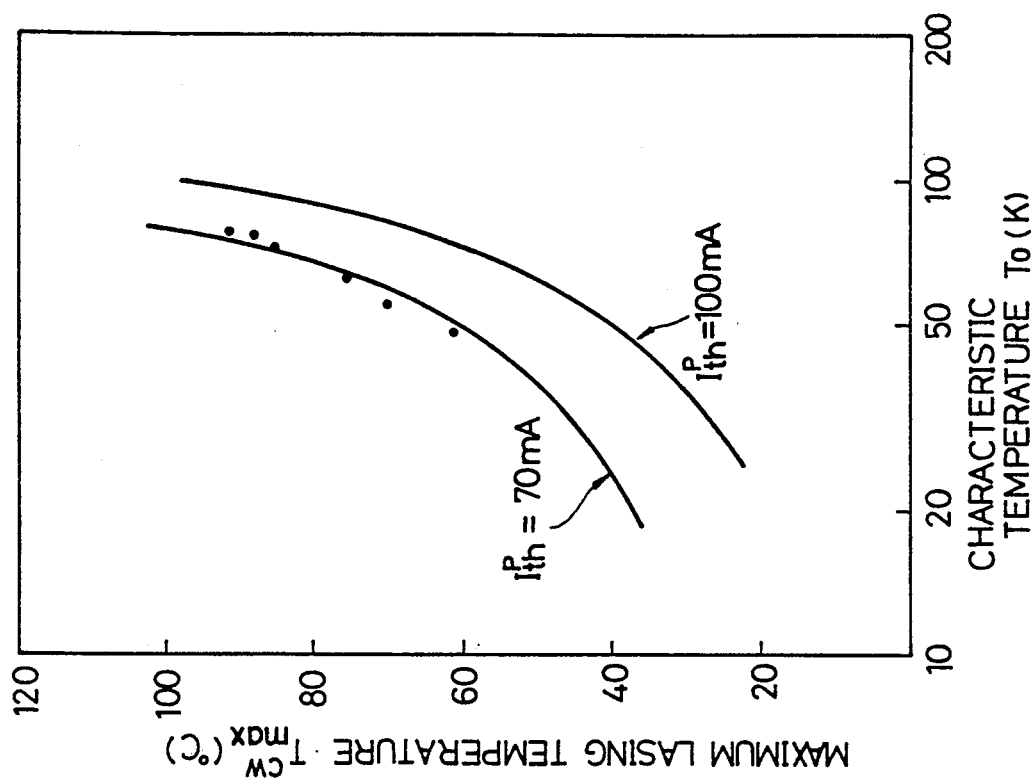
FIG. 10 is a graph of the maximum lasing temperature for continuous wave operation versus the characteristic temperature for the semiconductor laser device shown in FIG. 5.

Now, one parameter that characterizes the quality of a semiconductor laser device is a maximum lasing temperature $T_{max}$. This maximum lasing temperature $T_{max}$ has the following relationships with the other laser parameters the characteristic temperature $T_0$, a resistance in series $R_s$, a thermal resistivity $R_{th}$, and the threshold current for lasing $I_{th}{}^p$:

$$I_{th}{}^p = I_0 \cdot \exp(T/T_0)$$

$$I_{th}{}^{cw} = I_0 \cdot \exp[(T + \Delta T)/T_0]$$

$$\Delta T = (V_j + I_{th}{}^{cw} R_s) I_{th}{}^{cw} R_{th}$$

where $I_0$ is the value of the threshold current at 0° C., T is a heat sink temperature, $\Delta T$ is temperature increment in the active region, $V_j$ is a junction voltage, $I_{th}{}^{cw}$ is the threshold current for the continuous wave operation. The relationship between the maximum lasing temperature for continuous wave operation $T_{max}{}^{cw}$ and the the characteristic temperature $T_0$ with the threshold current for lasing $I_{th}{}^p$ as a variable given by the above relationships is plotted in FIG. 10. FIG. 10 shows that the maximum lasing temperature $T_{max}$ and the the characteristic temperature $T_0$ are proportional to each other, while the maximum lasing temperature $T_{max}$ the threshold current for lasing $I_{th}{}^p$ are inversely proportional to each other. The characteristic temperature $T_0$ is known to depend heavily on the impurity carrier concentration in the p-type cladding layer, and this relationship between the characteristic temperature $T_0$ and the impurity carrier concentration in the p-type cladding layer is plotted in FIG. 11 from experimental values. FIG. 11 shows that the characteristic temperature $T_0$ and the impurity carrier concentration in the p-type cladding layer are proportional to each other.

The relationships of the maximum lasing temperature $T_{max}$, the characteristic temperature $T_0$ and the threshold current density $J_{th}$ with respect to the composition of Al in the p-type cladding layer is plotted in FIG. 12 from experimental values. FIG. 12 shows, first of all, that the threshold current density $J_{th}$ is nearly 3 kA/cm$^2$ for $z = 0.4$, which is large, and is 1.8 kA/cm$^2$ for $z = 0.5$, which is still relatively large. But, for $z = 0.7$, the threshold current density $J_{th}$ is reduced to 1.3 kA/cm$^2$, so the value of $z = 0.7$ is much more desirable than $Z = 0.4$–0.5. Secondly, FIG. 12 shows that the characteristic temperature $T_0$ is proportional to z. In particular, the characteristic temperature $T_0$ changes from 70 K. to 85 K. as z varies from 0.5 to 0.7, so that the difference between the maximum lasing temperature in two extreme cases becomes almost 20° C.

It has also been observed that with Zn-doping, the carrier concentration in the p-type cladding layer can only be $1 \times 10^{17}$ cm$^{-3}$ for $z = 0.8$, so that the characteristic temperature $T_0$ and the maximum lasing temperature $T_{max}$ become low. However, for $z = 0.75$, the carrier concentration in the p-type cladding layer can be as large as $2 \times 10^{17}$ cm$^{-3}$, and the characteristic temperature $T_0$ can be as high as 100° C. On the other hand, it has been verified that in carrying out test operation at 50° C. with a semiconductor laser device using $In_{1-q}(Ga_{1-z}Al_z)_q P$ ($0 \leq q \leq 1$, $0 \leq z \leq 1$) it is difficult to achieve a stable lasing when the maximum lasing temperature for continuous wave operation $T_{max}{}^{cw}$ is less than 70° C. FIG. 10 indicates that the maximum lasing temperature for continuous wave operation $T_{max}^{cw}$ can become less than 70° C. only when $z \leq 0.6$.

From the foregoing discussion, it can be derived that the most desirable composition of Al in the p-type cladding layer is $0.65 \leq z \leq 0.75$. This range of the composition of Al corresponds to the photoluminescence peak wavelength at 25° C. of 530 nm to 550 nm.

For the similar reason, it is also desirable for the n-type $(Al_zGa_{1-z})_qIn_{1-q}P$ cladding layer to have the Al composition of $0.65 \leq z \leq 0.75$, although this is less significant than the case of p-type cladding layer as the n-type cladding layer plays less significant role in affecting the leakage of the carriers in the semiconductor laser device.

Figure 13:
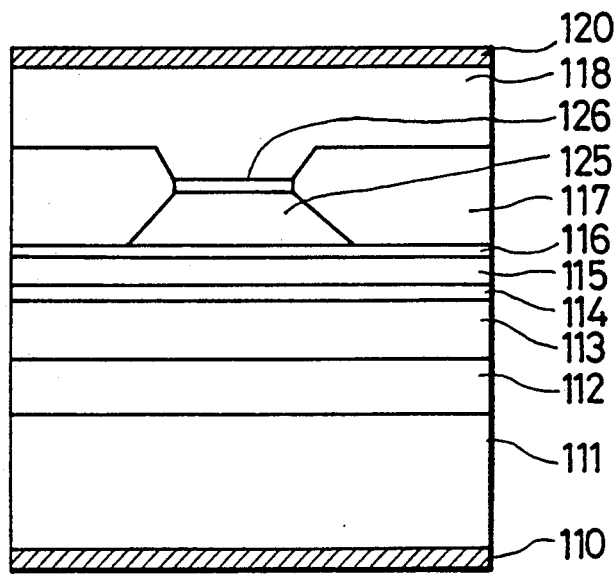
FIG. 13 is a schematic cross sectional view of a semiconductor laser device according to one alternative embodiment of the present invention.

Referring now to FIG. 13, there is shown one alternative configuration of the semiconductor laser device according to the present invention.

In this alternative configuration, the semiconductor laser device comprises multi-layer structure of, from bottom to top, an n-type AuGe electrode 110, an n-type GaAs substrate 111, a Si-doped n-type GaAs buffer layer 112, an n-type $In_{0.5}Ga_{0.15}Al_{0.35}P$ cladding layer 113, an $In_{0.5}Ga_{0.5}P$ active layer 114, a p-type $In_{0.5}Ga_{0.15}Al_{0.35}P$ cladding layer 115, a p-type $In_{0.5}Ga_{0.5}P$ etching stop layer 116, an n-type GaAs current block layer 117, a mesa shaped p-type $In_{0.5}Ga_{0.15}Al_{0.35}P$ cladding layer 125, a p-type $In_{0.5}Ga_{0.5}P$ intermediate band gap layer 126, a p-type $In_{0.5}Ga_{0.5}P$ contact layer 118, and a p-type AuZn electrode 120.

The procedure of growing is as follows. First, layers from the n-type GaAs substrate 11 to the p-type $In_{0.5}Ga_{0.5}P$ etching stop layer 116 are grown successively, and the mesa shaped p-type $In_{0.5}Ga_{0.15}Al_{0.35}P$ cladding layer 125 is formed. Then the n-type GaAs current block layer 117 is selectively formed around the mesa shaped p-type $In_{0.5}Ga_{0.15}Al_{0.35}P$ cladding layer 125, and the p-type $In_{0.5}Ga_{0.5}P$ intermediate band gap layer 126 is formed on the mesa shaped p-type $In_{0.5}Ga_{0.15}Al_{0.35}P$ cladding layer 125, and finally the p-type GaAs contact layer 118 are grown.

This configuration is characterized in that the p-type $In_{0.5}Ga_{0.15}Al_{0.35}P$ cladding layer 115 is as thin as 0.3 μm thick, and that the transverse mode is restricted because of the absorption by the n-type GaAs current block layer 117. Consequently, stable fundamental transverse mode lasing is obtainable with low threshold current. Furthermore, because of the p-type $In_{0.5}Ga_{0.5}P$ etching stop layer 116, superior etching control is possible as well.

The other features are the same as the previous configuration, i.e., that the carrier concentration in the $In_{0.5}Ga_{0.5}P$ active layer 14 is controlled to be less than or equal to $5 \times 10^{16}$ cm$^{-3}$, that the carrier concentration in the $In_{0.5}Ga_{0.15}Al_{0.35}P$ cladding layer 15 is set to be less than or equal to one half of the maximum carrier concentration obtainable by Zn-doping, and that the composition of Al in the p-type cladding layer is $0.65 \leq z \leq 0.75$.

Figure 14:
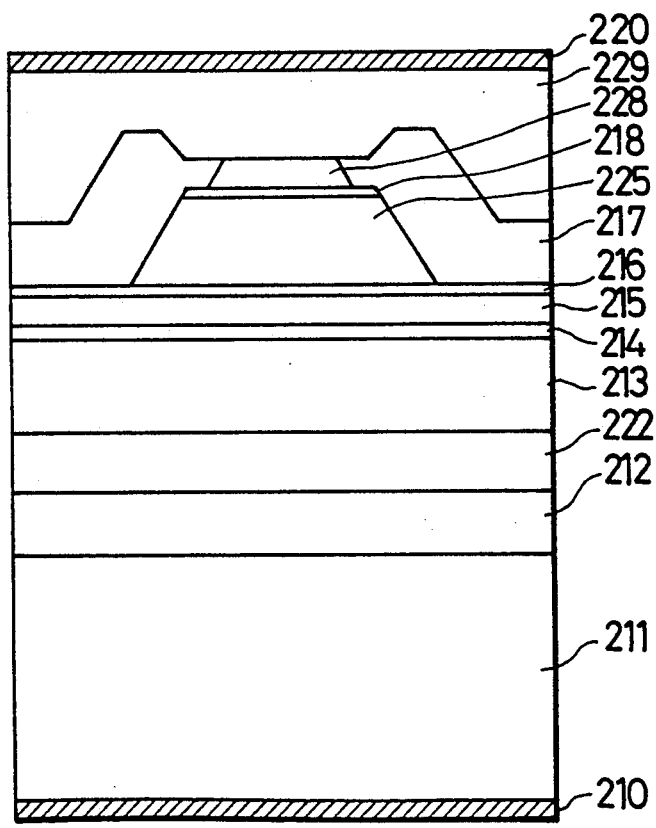
FIG. 14 is a schematic cross sectional view of a semiconductor laser device according to another alternative embodiment of the present invention.

Referring now to FIG. 14, there is shown another alternative configuration of the semiconductor laser device according to the present invention.

In this another alternative configuration, the semiconductor laser device comprises multi-layer structure of, from bottom to top, an n-type AuGe electrode 210, an n-type GaAs substrate 211, a Si-doped n-type GaAs buffer layer 212, a Si-doped n-type $In_{0.5}Ga_{0.5}P$ buffer layer 222, a Si-doped n-type $In_{0.5}Al_{0.5}P$ cladding layer 213, an $In_{0.5}Ga_{0.5}P$ active layer 214, a p-type $In_{0.5}Ga_{0.15}Al_{0.35}P$ cladding layer 215, a p-type $In_{0.5}Ga_{0.5}P$ etching stop layer 216, a Se-doped n-type GaAs current block layer 217, a mesa shaped p-type $In_{0.5}Ga_{0.15}Al_{0.35}P$ cladding layer 225, a p-type $In_{0.5}Ga_{0.5}P$ intermediate contact layer 218, n-type GaAs contact layers 228 and 229, and a p-type AuZn electrode 220.

In forming this configuration, the n-type GaAs current block layer 217 is doped with Se, because when the n-type GaAs current block layer 217 is to be grown on the mesa shaped p-type $In_{0.5}Ga_{0.15}Al_{0.35}P$ cladding layer 225 by MOCVD, the use of Si dopant will introduce Si in the place of the group V atoms which turns the n-type GaAs current block layer 217 into p-type in the vicinity of the re-growth boundary, because of the introduction of defects at the re-growth boundary and the approaching of the growth plane toward the (1,1,1)-plane, so that the function of the n-type GaAs current block layer 217 is hampered, although with Si-doping the controllabilty of the diffusion in the grown region can be improved because of the small difference in the refractive indices between the n-type GaAs current block layer 217 and the mesa shaped p-type $In_{0.5}Ga_{0.15}Al_{0.35}P$ cladding layer 225. With Se-doping, the difference in the refractive indices becomes larger and therefore the diffusion becomes greater, yet Se doping is necessary not only to maintain the GaAs current block layer 217 in n-type, but also to make the carrier concentration in the GaAs current block layer 217 to be over $3 \times 10^{18}$ cm$^{-3}$ which is required for the large enough output.

The p-type $In_{0.5}Ga_{0.5}P$ intermediate contact layer 218 is provided in order to reduce the resistance between the mesa shaped p-type $In_{0.5}Ga_{0.15}Al_{0.35}P$ cladding layer 225 and the n-type GaAs contact layer 228, and is a superlattice with a band gap larger than that of the n-type GaAs contact layer 228 but not larger than that of the mesa shaped p-type $In_{0.5}Ga_{0.15}Al_{0.35}P$ cladding layer 225. The band gap of the p-type $In_{0.5}Ga_{0.5}P$ intermediate contact layer 218 may be made to vary gradually such that the band gaps agree at the boundaries of adjacent layers.

The other features are the same as the previous configuration, i.e., that the carrier concentration in the $In_{0.5}Ga_{0.5}P$ active layer 14 is controlled to be less than or equal to $5 \times 10^{16}$ cm$^{-3}$, that the carrier concentration in the $In_{0.5}Ga_{0.15}Al_{0.35}P$ cladding layer 15 is set to be less than or equal to one half of the maximum carrier concentration obtainable by Zn-doping, and that the composition of Al in the p-type cladding layer is $0.65 \leq z \leq 0.75$.

Next, a method of manufacturing this configuration of the semiconductor laser device according to the present invention will be explained.

The double heterowafer was formed by the reduced pressure MOCVD using trimethylindium(TMIn), trimethylgallium(TMGa), and trimethylalminum(TMAl) which are the group III methyl metalorgans, and arsine(AsH$_3$) and phosphine(PH$_3$) which are the group V hydrides, as raw materials. Also, silane(SiH$_4$), hydrogen selenide(H$_2$Se), dimethylzinc(DMZn), and cyclopentadienyl magnesium(Cp$_2$Mg) were used as raw materials for dopants. The growing took place in the pressure of 15 to 35 Torr and the GaAs substrate temperature of 745° to 755° C., with the growing speed of 2 μm/h. This manufacturing method is characterized in that the silane gas is utilized in doping the n-type cladding layer. Thus, in growing the n-type cladding layer on the GaAs substrate which is heated up in the reaction chamber with the raw material gases, the silane gas is used as a raw material gas for doping.

The procedure of growing is as follows. First, the n-type GaAs substrate 211 of $5\times10^{17}$ cm$^{-3}$ Si concentration, the 0.5 μm thick n-type GaAs buffer layer 212 of $5\times10^{17}$ cm$^{-3}$ Si concentration, the 0.5 μm thick n-type $In_{0.5}Ga_{0.5}P$ buffer layer 222 of $5\times10^{17}$ cm$^{-3}$ Si concentration, the 1.0 μm thick n-type $In_{0.5}Al_{0.5}P$ cladding layer 213 of $5\times10^{17}$ cm$^{-3}$ Si concentration, the 0.06 μm thick $In_{0.5}Ga_{0.5}P$ active layer 214, the 0.2 μm thick p-type $In_{0.5}Ga_{0.15}Al_{0.35}P$ cladding layer 215 of $1\times10^{18}$ cm$^{-3}$ Mg concentration, the 0.01 μm thick p-type $In_{0.5}Ga_{0.5}P$ etching stop layer 216 of $1\times10^{18}$ cm$^{-3}$ Mg concentration, the 1 μm thick mesa shaped p-type $In_{0.5}Ga_{0.15}Al_{0.35}P$ cladding layer 255 of $1\times10^{18}$ cm$^{-3}$ Mg concentration, the 0.01 μm thick p-type $In_{0.5}Ga_{0.5}P$ intermediate contact layer 218, and the 0.5 μm thick n-type GaAs contact layer 228 of $1\times10^{18}$ cm$^{-3}$ Mg concentration on the mesa shaped p-type $In_{0.5}Ga_{0.15}Al_{0.35}P$ cladding layer 225 were grown in succession. Then, the 0.5 μm thick n-type GaAs current block layer 217 of $5\times10^{18}$ cm$^{-3}$ Se concentration was grown except on the n-type GaAs contact layer 228 by using $SiO_2$ masking and selective growing, and then the n-type GaAs contact layers 229 of $1\times10^{18}$ cm$^{-3}$ Zn concentration was grown.

Figure 15:
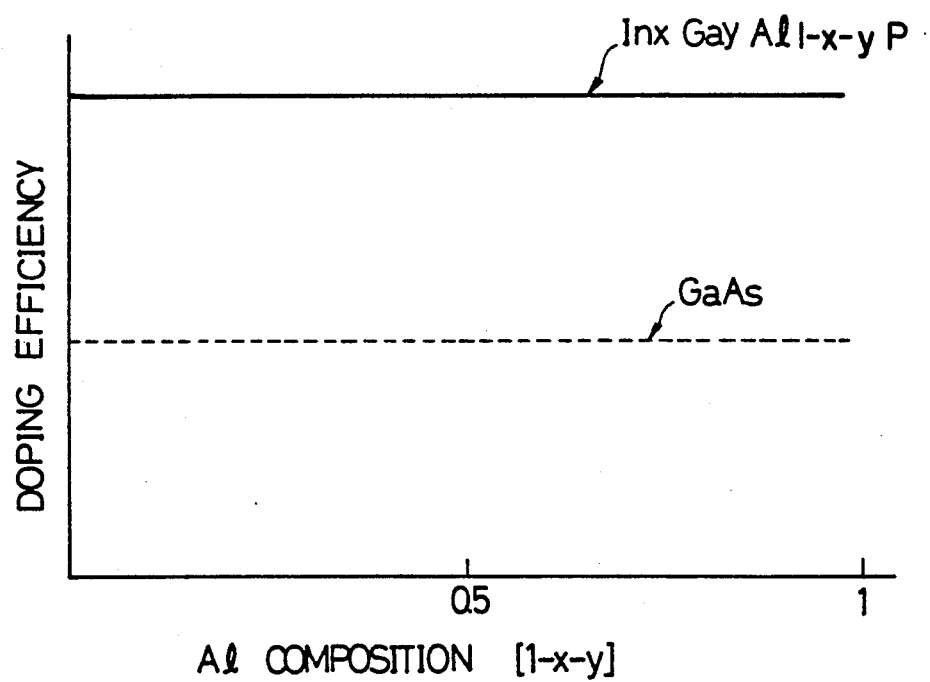
FIG. 15 is a graph of doping efficiencies of Se-doping from H$_2$Se in MOCVD for growing on GaAs substrate, $In_xGa_yAl_{1-x-y}P$ ($0 \leq x \leq 1$, $0 \leq y \leq 1$), and GaAs for the semiconductor laser device shown in FIG. 14.

This double heterowafer was manufactured by the conventional manner into a semiconductor laser device of 250 μm resonant cavity length and 5 μm stripe width which were able to be lased with the threshold current of 40 mA. The light output had reached over 30 mW, and good current vs light output characteristics without any kinks were observed. Moreover, the distribution of the threshold current inside and outside of the double heterowafer was observed to be within ±10% which indicate very good reproduction. Furthermore, because of the Si-doping of the n-type cladding layer, the doping efficiency was almost independent of the Al composition in the n-type cladding layer, as shown in FIG. 15.

As explained so far, according to this embodiment it is possible to provide a semiconductor laser device using $In_xGa_yAl_{1-x-y}P$ ($0\leq x\leq 1$, $0\leq y\leq 1$) capable of preventing the leakage of the carriers and thereby suppressing the threshold current, by controlling the carrier concentration in the $In_{0.5}Ga_{0.5}P$ active layer 14 to be less than or equal to $5\times10^{16}$ cm$^{-3}$. In addition, according to this embodiment it is possible to make such a semiconductor laser device to be operative with small threshold current density and at high temperature, by setting the carrier concentration in the p-type cladding layer to be less than a half of the maximum value obtainable, which is $2.5\times10^{17}$ cm$^{-3}$. Furthermore, according to this embodiment it is possible to make such a semiconductor laser device to be able to carry out stable continuous wave operation over considerably longer period of time, by setting the carrier concentration in the n-type cladding layer to be less than $5\times10^{17}$ cm$^{-3}$ with Si as impurity.

It is to be noted that many modifications and variations of these embodiments may be made without departing from the novel and advantageous features of the present invention. Accordingly, all such nodifications and variations are intended to be included within the scope of the appended claims.

What is claimed is:

1. A semiconductor laser device, comprising:
   a resonant cavity;
   two electrodes;
   a GaAs substrate positioned between the two electrodes, and
   a double heterostructure formed on the GaAs substrate, comprising an active layer positioned between two cladding layers of an alloy $In_{1-x}(Ga_{1-y}Al_y)_xP$ in which $0<x<1$ and $0<y\leq 1$ and having a carrier concentration less than $5\times10^{16}$ cm$^{-3}$.

2. The device of claim 1, wherein the double heterostructure further includes a Zn-doped p-type cladding layer, the Zn-doped p-type cladding layer having a carrier concentration not greater than one half of a maximum value for the carrier concentration obtainable by Zn-doping.

3. The device of claim 1, wherein the double heterostructure comprises:
   an n-type cladding layer of the quaternary alloy of InGaAlP;
   an InGaP active layer in contact with the n-type cladding layer
   a p-type cladding layer of the alloy of InGaAlP in contact with the InGaP active layer;
   a p-type InGaP capping layer in contact with the p-type cladding layer;
   an n-type GaAs block layer in contact with the p-type InGaP capping layer; and
   a p-type GaAs contact layer in contact with the n-type GaAs block layer including a current pinching section which is also in contact with the p-type InGaP capping layer.

4. The device of claim 1, wherein the double heterostructure comprises:
   an n-type cladding layer of the alloy of InGaAlP;
   an InGaP active layer in contact with the n-type cladding layer;
   a p-type cladding layer of the alloy of InGaAlP in contact with the InGaP active layer;
   a p-type InGaP etching stop layer in contact with the p-type cladding layer;
   an n-type GaAs current block layer in contact with the p-type InGaP etching stop layer;
   a mesa-shaped p-type cladding layer of the the alloy of InGaAlP in contact with the InGaP etching stop layer;
   a p-type InGaP intermediate band gap layer in contact with the mesa-shaped p-type cladding layer; and
   a p-type InGaP contact layer in contact with the n-type GaAs current block layer including a section which is also in contact with the p-type InGaP intermediate band gap layer.

5. The semiconductor laser device of claim 1, wherein the n-type cladding layer is Si-doped.

6. The device of claim 5, wherein the Si-doped n-type cladding layer has a carrier concentration less than $5\times10^{17}$ cm$^{-3}$.

7. The device of claim 5, further comprising a n-type GaAs current block layer in contact with the p-type cladding layer, the current block layer being Se-doped.

8. The device of claim 1, wherein the active layer is $In_{1-m}(Ga_{1-n}Al_n)_mP$ in which $0<m<1$ and $0\leq n<1$.

9. The device of claim 8, wherein one of the cladding layers is an n-type cladding layer of $In_{1-x}(Ga_{1-y}Al_y)_xP$ where $0<x<1$ and $0<y\leq 1$, and the other cladding layer is a p-type cladding layer of $In_{1-s}(Ga_{1-t}Al_t)_sP$ where $0<s<1$ and $0\leq t<1$ in contact with the active layer.

10. A semiconductor laser device, comprising:
    a resonant cavity;

two electrodes;

a GaAs substrate positioned between the two electrodes, and a double heterostructure formed on the GaAs substrate, comprised of InGaP active layer and a p-type cladding layer of an alloy of $In_{1-q}(Ga_{1-z}Al_z)_qP$ wherein z is between 0.65 and 0.75 and q is less than 1.

11. The device of claim 10, wherein q is between 0.45 and 0.55.

12. The device of claim 11, wherein the p-type cladding layer has a carrier concentration between $2 \times 10^{17}$ cm$^{-3}$ and $5 \times 10^{17}$ cm$^{-3}$.

13. The device of claim 11, wherein the p-type cladding layer has a photoluminescence peak wavelength between 530 nm and 550 nm.

14. The device of claim 10, wherein the double heterostructure further comprises an n-type cladding layer of an alloy $In_{1-h}(Ga_{1-g}Al_g)_hP$ wherein z is between 0.65 and 0.75, $0<g<1$ and $0<h<1$.

15. The device of claim 14, wherein a value of q is between 0.45 and 0.55.

16. The device of claim 15, wherein the p-type cladding layer has a carrier concentration between $2 \times 10^{17}$ cm$^{-3}$ and $5 \times 10^{17}$ cm$^{-3}$.

17. The device of claim 15, wherein the p-type cladding layer has a photoluminescence peak wavelength between 530 nm and 550 nm.

18. The device of claim 10, wherein the active layer is $In_{1-m}(Ga_{1-n}Al_n)_mP$ in which $0<m<1$ and $0 \leq n<1$.

19. The device of claim 10, wherein the double heterostructure further comprises:

a p-type $In_{1-j}(Ga_{1-k}Al_k)_jP$ ($0<j<1$, $0 \leq k<1$) etching stop layer in contact with the p-type $In_{1-s}(Ga_{1-t}Al_t)_sP$ ($0<s<1$, $0<t<1$) cladding layer and the mesa-shaped p-type $In_{1-e}(Ga_{1-f}Al_f)_eP$ ($0<e<1$, $0<f \leq 1$) cladding layer;

an n-type GaAs current block layer in contact with the p-type $In_{1-j}(Ga_{1-k}Al_k)_jP$ ($0<j<1$, $0 \leq k<1$) etching stop layer;

a p-type $In_aGa_{1-a}P$ ($0<a<1$) intermediate band gap layer in contact with the mesa-shaped p-type $In_{1-e}(Ga_{1-f}Al_f)_eP$ ($0<e<1$, $0<f \leq 1$) cladding layer; and a p-type $In_cGa_{1-c}P$ ($0<c<1$) contact layer in contact with the n-type GaAs current block layer including a section which is also in contact with the p-type $In_aGa_{1-a}P$ ($0<a<1$) intermediate band gap layer.

20. The semiconductor laser device of claim 10, wherein the n-type cladding layer is Si-doped.

21. The device of claim 20, wherein the Si-doped n-type cladding layer has a carrier concentration less than $5 \times 10^{17}$ cm$^{-3}$.

22. The device of claim 20, further comprising a n-type GaAs current block layer in contact with the p-type cladding layer, the current block layer being Si-doped.

* * * * *